United States Patent [19]
Barr et al.

[11] Patent Number: 5,732,744
[45] Date of Patent: Mar. 31, 1998

[54] METHOD AND APPARATUS FOR ALIGNING AND SUPPORTING SEMICONDUCTOR PROCESS GAS DELIVERY AND REGULATION COMPONENTS

[75] Inventors: Thomas Aloysius Barr; Christopher Velton Barr; James Charles Elliott; Dirk Alan Frew, all of Albuquerque, N. Mex.

[73] Assignee: Control Systems, Inc., Rio Rancho, N. Mex.

[21] Appl. No.: 612,731

[22] Filed: Mar. 8, 1996

[51] Int. Cl.[6] .................... F16L 3/00; F16L 55/00; F17D 1/02; C23C 16/00
[52] U.S. Cl. .................... 138/106; 137/315; 137/613; 248/65; 248/74.4; 285/61; 118/715
[58] Field of Search .................... 248/74.1, 74.4, 248/65; 138/106, 107; 137/315, 317, 318, 613; 285/61, 64; 118/715

[56] References Cited

U.S. PATENT DOCUMENTS

| | | | |
|---|---|---|---|
| 1,722,236 | 7/1929 | Schoneberger | 285/61 |
| 2,761,714 | 9/1956 | Cuskie | 403/225 |
| 3,414,219 | 12/1968 | Siegel | 248/65 |
| 3,999,784 | 12/1976 | Kennedy | 285/62 |
| 4,267,994 | 5/1981 | Lynch et al. | 248/65 |
| 4,429,497 | 2/1984 | Didernardi | 52/27 |
| 4,927,103 | 5/1990 | Nicholson | 248/62 |
| 5,421,383 | 6/1995 | Schmid | 141/232 |

FOREIGN PATENT DOCUMENTS

| | | | |
|---|---|---|---|
| 620397 | 10/1994 | European Pat. Off. | 138/106 |
| 2262986 | 7/1973 | Germany | 248/74.4 |
| 3810185 | 12/1988 | Germany | 248/74.1 |

Primary Examiner—R. Bruce Breneman
Assistant Examiner—Jeffrie R. Lund

[57] ABSTRACT

A mounting system, for supporting semiconductor process gas delivery and control components for assembly and use as a gas stick, aligns the connection union seals between fittings on adjacent components to absorb accumulated stresses resulting from manufacturing tolerances and reduce the likelihood of seal leakage. Components are mounted on individual upper clamp members which are secured to lower clamp members to form a slidable but non-rotatable radially aligned yoke around a rigid elongate support member for subsequent longitudinal positioning and joining of adjacent fittings.

12 Claims, 2 Drawing Sheets

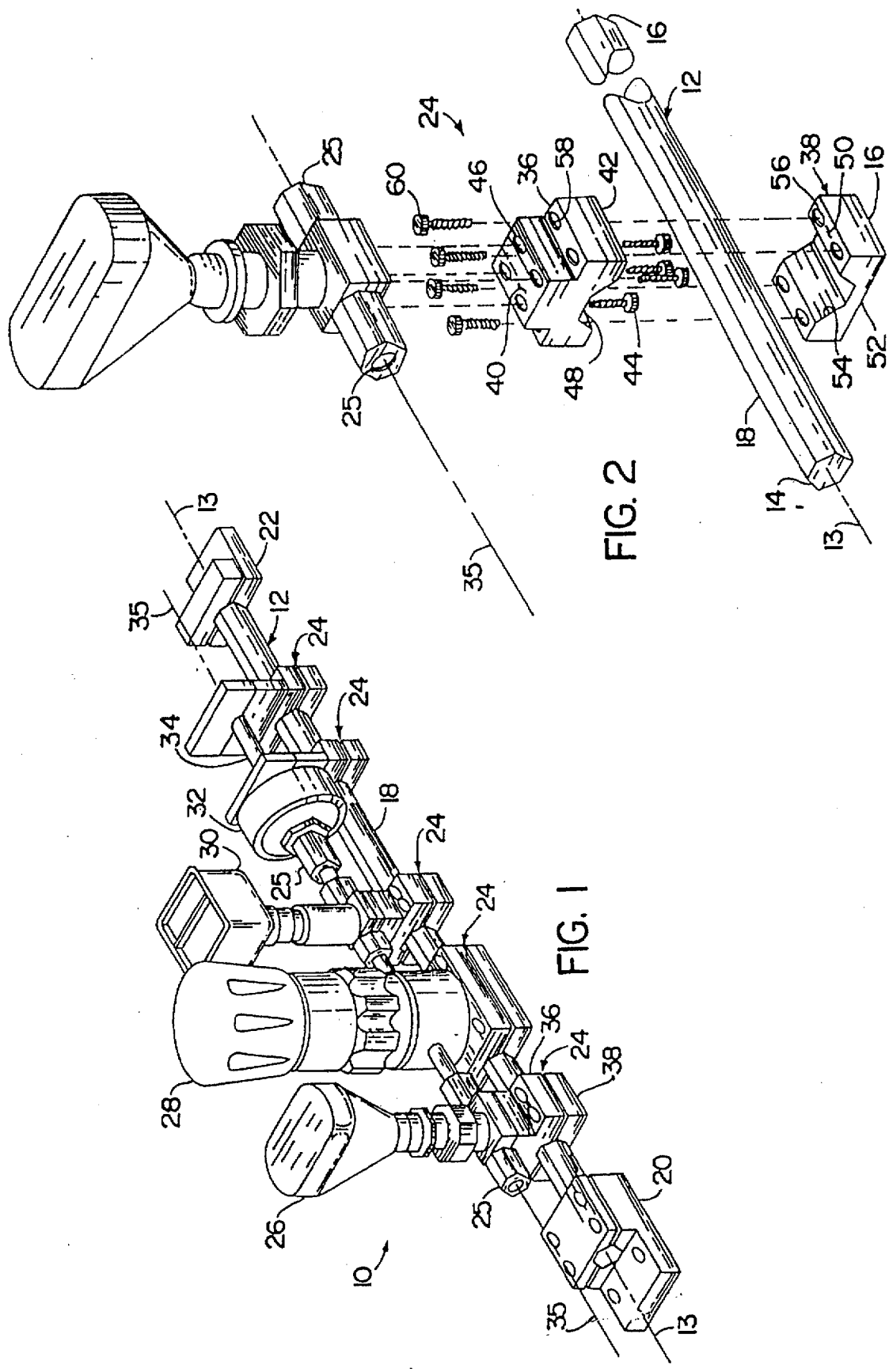

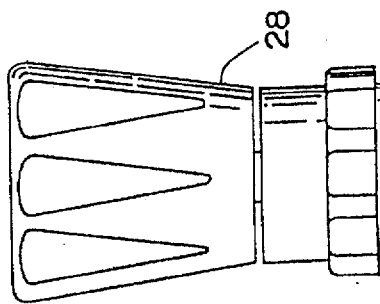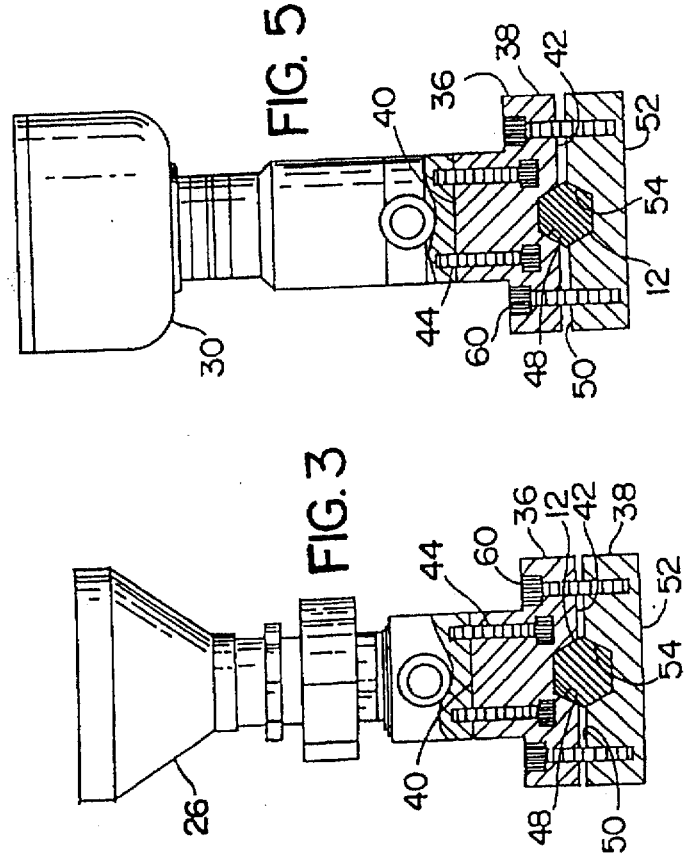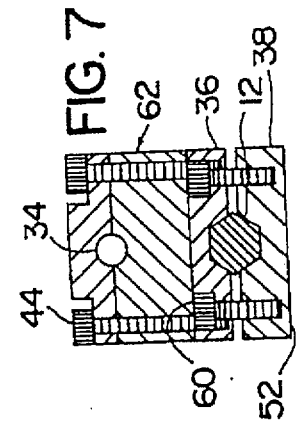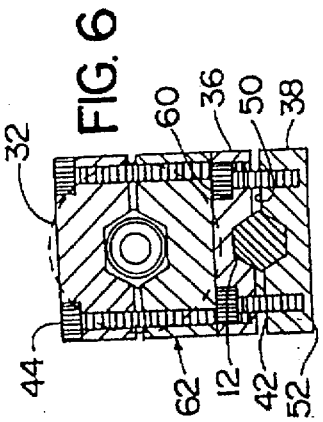

METHOD AND APPARATUS FOR ALIGNING AND SUPPORTING SEMICONDUCTOR PROCESS GAS DELIVERY AND REGULATION COMPONENTS

BACKGROUND OF THE INVENTION

1. Technical Field

The present invention relates to a method and apparatus for the assembling of components for delivering and regulating process gases for semiconductor fabrication and, more particularly, to a mounting method and system to assure component alignment and reduce the likelihood of union fitting seal leaks in such semiconductor process gas stick assemblies.

2. Discussion of the Prior Art

The semiconductor industry relies on the distribution of numerous process gases (i.e., $N_2$, $O_2$, ozone, etc.) in, among other procedures, the fabrication of wafers of very pure silicon used to form specifically oriented crystals for subsequent slicing and polishing. Integral to the required precise gas distribution is a sequence of individual control components, such as valves, regulators and transducers, mated together at seal junctions along a configuration known as a gas stick. These gas sticks are assembled by attaching each required component to a stand-off mount, bolting the first component mount in the required stick sequence to a fixed mounting plate, then sequentially adding adjacent components to one another via union fitting junctions and to the mounting plate via bolts passing through the stand-off mounts into preformed bolt holes in the mounting plate.

The manufacturing tolerances inherent to each of the individual gas stick components accumulate as the components are joined together and stresses and misalignments between adjacent components are induced by the rigid attachment of each component to the mounting plate. This results in frequent costly reworking of the stick and an increased likelihood of potentially dangerous leak formations in the seals at the unions between adjacent component fittings.

OBJECTS AND SUMMARY OF THE INVENTION

Accordingly, it is a primary objective of the present invention to provide a method and apparatus for supporting semiconductor process gas delivery and regulation components during fabrication and use.

It is a further object of the present invention to reduce the incidence of union leaks in the seals formed between adjacent components in a semiconductor process gas stick.

It is also an object of the present invention to provide a self-aligning gas stick fabrication mount to facilitate the subsequent addition and removal of components from the sequence of semiconductor process gas regulation components.

The aforesaid objects are achieved individually and in combination and it is not intended that the invention be construed as requiring that two or more of said objects be combined.

In accordance with the present invention, an upper clamp member extending downward and having a centerline slot or groove formed in the lower surface is attached to each gas stick component, and the component and upper clamp member are placed on a rigid support rod, the slot on each upper clamp member lower surface non-rotatably mating or interlocking with the upper surface of the support rod. A lower clamp member having a centerline slot or groove formed in the upper surface is placed under the support rod opposite each component upper clamp member, the lower clamp member upper slot non-rotatably mating with the support rod lower surface. The upper clamp member is attached over the support rod to the lower clamp member with partially-tightened bolts allowing the attached upper and lower clamp to slide along the support rod. Subsequent components are similarly fitted slidingly onto the support rod and the adjacent fittings are sealingly mated to each other. The adjacently mated and aligned sequence of components is then secured to the support rod by applying a fixed value torque to the bolts mating the upper and lower clamp members together.

The present invention provides an easily assembled alignment and positioning apparatus for gas stick components while absorbing the stresses resulting from accumulated manufacturer's fitting tolerances of the individual components minimizing the strain imposed on critical union seals.

The above and still further objects, features and advantages of the present invention will become apparent upon considering the following detailed description of preferred embodiments thereof, particularly when viewed in connection with the accompanying drawings wherein like reference numerals in various figures are used to designate like components.

BRIEF DESCRIPTION OF THE DRAWINGS

FIG. 1 is a perspective view of a semiconductor process gas stick supported on a hex rod mount system according to the present invention.

FIG. 2 is an exploded perspective view of a component mount according to the present invention.

FIG. 3 is a cross-sectional view of a valve mount according to the present invention.

FIG. 4 is a cross-sectional view of a regulator mount according to the present invention.

FIG. 5 is a cross-sectional view of a transducer mount according to the present invention.

FIG. 6 is a cross-sectional view of a filter mount according to the present invention.

FIG. 7 is a cross-sectional view of a tube mount according to the present invention.

DESCRIPTION OF THE PREFERRED EMBODIMENT

Referring to FIGS. 1 and 2, a gas stick component mount system 10 includes an elongate hex rod 12 having a hexagonal cross-section, a longitudinal axis 13, a first end 14, a second end 16 and an intermediate section 18 therebetween. Rod 12 is non-rotatably supported above a bench or other work surface at or near first end 14 by a forward support mount 20 and at or near a second end 16 by a rearward support mount 22, and a sequence of specially configured component mounts 24 are attached longitudinally along hex rod intermediate section 18 to align and support the input/output fittings 25 of gas stick components during assembly, reconfiguration and use. Support mounts 20 and 22 provide a stand-off or spaced relation between rod 12 and the work surface and may be provided with means for rigid attachment to the work surface. The gas stick components shown include a valve 26, a regulator 28, a transducer 30 and a filter 32 as well as the gas line or tube 34, but mounts similarly configured to compatibly integrate with the present component mount system and support other types, sizes and shapes of gas stick components along a common union axis 35 aligned along the input/output fittings 25 of each of the components are also contemplated and considered to fall within the scope of the invention described herein.

A typical component mount 24, shown in more detail in FIG. 2, includes an upper clamp member 36 and a lower clamp member 38. Upper clamp member 36 has an upper surface 40 and a lower surface 42. A gas stick component is rigidly attached to upper member upper surface 40 by, for instance, component mounting screws 44 extending upward through boreholes 46 in upper clamp member 36 and received by threaded boreholes (not shown) formed in the lower surface of the component. A first slot or groove 48 is formed along the upper member lower side 42. Slot 48 is configured or contoured to conform to and slidably but non-rotatably receive and interlock with a length of the contoured upper surface of hex rod intermediate section 18.

Lower clamp member 38 has an upper surface 50 and a lower surface 52. A second slot 54 is formed along the lower member upper side 50. Second slot 54 is similarly configured or contoured to conform to and slidably but non-rotatably receive and interlock with a corresponding lower surface of hex rod intermediate section 18.

Lower clamp member 38 is configured to align under upper clamp member 36 and has threaded boreholes 56 formed in lower clamp upper surface 50 to register with throughholes 58 formed in upper clamp member 36 when the two clamp members are assembled. Clamping screws 60 extend downward through holes 58 into threaded boreholes 56 to attach upper clamp member 36 to lower clamp member 38 encasing a length of hex rod 12 in registered slots 48 and 54.

FIGS. 3–7 show representative mount assemblies for a variety of gas stick components, each sized to position the gas input/output fittings 25 and the union junctions or seals formed therebetween along a common union axis 35 at a fixed radial or stand-off distance from the hex rod 12. In the case of the filter mount and the tube mounting of FIGS. 6 and 7, respectively, the gas stick component can alternatively be secured within a guillotine-type encasing assembly 62 which is attached to the lower clamp member.

In use, each component of a semiconductor process gas stick to be assembled is secured to a corresponding upper clamp member with, for example, component mounting screws 44. Clamps or bolts or adhesives could, alternatively, be used to attach the components to the upper clamps. Each component-upper clamp combination is then secured over and onto hex rod 12 in the longitudinally appropriate sequence by positioning the corresponding lower clamp member 38 under hex rod 12 with a lower portion of hex rod received in second slot 54, then lowering the component-upper clamp combination down onto hex rod 12 such that an upper portion of the hex rod is received in first slot 48. Throughholes 58 in upper clamp member 36 are positioned in registry with threaded boreholes 56 in lower clamp member 38, and the two clamps are secured together by, for example, clamping screws 60 tightened sufficiently to join or mate the two clamps in a slidable but non-rotatable yoke or collar surrounding hex rod 12. Bolts, clamps or other variably adjustable mechanical means could alternatively be used to attach the two clamps together. Angular alignment of the components is assured by the non-rotatable mating of the sides of hex rod 12 with the correspondingly formed slots 48 and 54 in the upper and lower clamps 36 and 38, respectively, and radial or stand-off alignment results from the spacing geometry of the upper clamps. Longitudinal positioning of components along the gas stick axis 13 is achieved by sliding the corresponding clamps along the hex rod until the fittings of adjacent components are adjacent one another and are aligned along a common union axis 35. Adjacent fittings are then mated together in fully aligned union seals. After each of the components has been thus secured to form the desired gas stick, the clamping screws 60 or other attachment means in each clamp pair are tightened gradually and evenly to rigidify the stick while avoiding the introduction of flexure stresses into the union seals.

Although in a preferred embodiment the longitudinal support member has been described as a hexagonal cross-section rod non-rotatably clamped by correspondingly contoured slots in the upper and lower clamp members, any configuration of longitudinal rod and corresponding clamp or yoke assembly having mutually interacting or interlocking cross-sectional geometry permitting relative longitudinal motion while preventing relative rotational movement can be used, for example a single contoured slot formed in either the upper or lower clamp member could be used with similar effect. Moreover, although stainless steel is a preferred material for the longitudinal rod, other hard materials could be similarly used. Aluminum clamps are preferred for weight consideration purposes, but, again, other rigid materials could be substituted.

From the foregoing description, it will be appreciated that the present invention makes available a method and apparatus for supporting and aligning gas stick components during assembly and use to prevent or minimize the effects of tolerance stack-up or accumulation that result in seal stresses at the component unions and attendant costly and potentially dangerous seal leaks. The longitudinal adjustability and simple non-rotatable attachment of component clamps along the hex rod provide for efficient addition and removal of components when gas stick reconfiguration is required.

Having described preferred embodiments of a new and improved gas stick component mount system, and a method for aligning and supporting gas stick components for assembly and employment, it is believed that other modifications, variations and changes will be suggested to those skilled in the art in view of the teachings set forth herein. It is therefore to be understood that all such modifications, variations and changes are believed to fall within the scope of the present invention as defined by the appended claims.

What is claimed is:

1. A mount system to align and support gas stick semiconductor process gas delivery and regulation components along a common axis, said mount comprising:

an elongate support member having a first end, a second end, an intermediate section therebetween, and a longitudinal axis;

a plurality of component mounts attachable along said intermediate section, said plurality of component mounts sized to support gas stick components at a selected distance from said support member;

means for rigidly attaching gas stick components to each of said plurality of component mounts;

means for slidably but non-rotatably attaching said plurality of component mounts to said support member in a common radial alignment with respect to said support member longitudinal axis; and means for rigidly attaching said plurality of component mounts to said support member.

2. The gas stick component mount system of claim 1 wherein said elongate support member is a hex rod having a hexagonal cross-section and a longitudinal axis.

3. The gas stick component mount system of claim 1 wherein each of said plurality of component mounts includes an upper clamp member having an upper surface and a lower surface and a lower clamp member having an upper surface and a lower surface, wherein at least one of said upper clamp member lower surface and said lower clamp member upper surface has a slot formed therein configured to slidably but non-rotatably receive a portion of said elongate support member intermediate section.

4. The gas stick component mount system of claim 3 wherein said means for slidably but non-rotatably attaching said plurality of component mounts includes means for attaching said upper clamp member to said lower clamp member with a portion of said support member received in said at least one slot therebetween.

5. The gas stick component mount system of claim 3 wherein said means for rigidly attaching gas stick components to each of said upper clamp members includes mounting screws, extending through boreholes formed in said upper clamp members into threaded boreholes formed in said components.

6. The gas stick component mount system of claim 3 wherein said means for slidably but non-rotatably attaching said upper clamp members to said lower clamp members comprises clamping screws, extending through holes formed in said upper clamp members into threaded boreholes formed in said lower clamp members.

7. The gas stick component mount system of claim 3 further comprising a forward support mount and a rearward support mount for supporting said elongate support member in a spaced relation to a work surface to permit slidable positioning of said lower clamp member between said elongate support member and the work surface.

8. The gas stick component mount system of claim 1 wherein each of said plurality of component mounts comprises an upper clamp member and a lower clamp member, said upper clamp member having a lower surface, said lower surface having a first slot formed therein, said first slot configured to slidably but non-rotatably receive an upper portion of said support member intermediate section, and said lower clamp member having an upper surface, said upper surface having a second slot formed therein, said second slot configured to slidably but non-rotatably receive a lower portion of said support member intermediate section, and said means for slidably but non-rotatably attaching said plurality of component mounts includes means for attaching said upper clamp members to said lower clamp members with said support member segment received therebetween.

9. A method for aligning and supporting the semiconductor process gas delivery and regulation components of a gas stick along a common axis for the joining of adjacent union fittings therebetween, the method comprising:

rigidly attaching each gas stick component to a component mount;

slidably but non-rotatably attaching each of said component mounts to a rigid elongate support member spaced from a work surface;

sliding adjacent said components into input/output fitting adjacent one to another;

uniting adjacent said components at union junctions therebetween to form the gas stick; and rigidly attaching each of said component mounts to said rigid elongate support member.

10. The method of claim 9 further comprising the prior step of mounting said elongate support member to a work surface.

11. A method for aligning and supporting each of the semiconductor process gas delivery and regulation components of a gas stick along a common axis for the joining of adjacent input/output fittings therebetween, the method comprising:

rigidly attaching each gas stick component to the upper surface of an upper clamp member;

positioning a lower clamp member under a rigid elongate support member having a longitudinal axis;

positioning the lower surface of said upper clamp member over said rigid elongate support member longitudinally aligned over said lower clamp member;

securing said upper clamp member to said lower clamp member to form a slidable but non-rotatable yoke around said rigid elongate member;

sliding adjacent said yokes into fitting-engaging proximity one to another;

sealingly joining adjacent component input/output fittings one to another; and further securing said upper clamp members to said corresponding lower clamp members to form non-slidable rigid attachments to said elongate support member.

12. The method of claim 11 wherein said slidable but non-rotatable yoke is formed by the interlocking of the contoured surface of a portion of said support member with the correspondingly contoured surface of at least one slot formed in at least one of said upper and lower clamp members to radially align said non-rotatable yokes with respect to said support member longitudinal axis.

* * * * *